(12) United States Patent
Han (10) Patent No.: US 9,502,555 B2
(45) Date of Patent: Nov. 22, 2016

(54) SEMICONDUCTOR DEVICE AND FABRICATING METHOD THEREOF

(71) Applicant: Magnachip Semiconductor, Ltd., Cheongju-si (KR)

(72) Inventor: Jin Woo Han, Bucheon-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 13/875,941

(22) Filed: May 2, 2013

(65) Prior Publication Data

US 2013/0334596 A1    Dec. 19, 2013

(30) Foreign Application Priority Data

Jun. 15, 2012 (KR) .................. 10-2012-0064548

(51) Int. Cl.
| | |
|---|---|
| H01L 29/78 | (2006.01) |
| H01L 29/66 | (2006.01) |
| H01L 29/40 | (2006.01) |
| H01L 29/417 | (2006.01) |
| H01L 29/423 | (2006.01) |

(52) U.S. Cl.
CPC ......... H01L 29/7827 (2013.01); H01L 29/407 (2013.01); H01L 29/41741 (2013.01); H01L 29/4238 (2013.01); H01L 29/42372 (2013.01); H01L 29/66666 (2013.01); H01L 29/66734 (2013.01); H01L 29/7811 (2013.01); H01L 29/7813 (2013.01)

(58) Field of Classification Search
CPC .................................................. H01L 29/6666
USPC ........................................................ 257/331
See application file for complete search history.

(56) References Cited

U.S. PATENT DOCUMENTS

| | | | |
|---|---|---|---|
| 6,750,508 B2 * | 6/2004 | Omura | H01L 29/8725 257/329 |
| 6,891,223 B2 | 5/2005 | Krumrey et al. | |
| 7,859,047 B2 * | 12/2010 | Kraft et al. | 257/330 |
| 2002/0030237 A1 * | 3/2002 | Omura | H01L 29/0634 257/397 |
| 2005/0167742 A1 * | 8/2005 | Challa et al. | 257/328 |
| 2006/0157779 A1 * | 7/2006 | Kachi et al. | 257/330 |
| 2006/0214221 A1 * | 9/2006 | Challa et al. | 257/328 |
| 2006/0281249 A1 * | 12/2006 | Yilmaz et al. | 438/243 |
| 2007/0037327 A1 * | 2/2007 | Herrick et al. | 438/151 |
| 2012/0205737 A1 * | 8/2012 | Chen et al. | 257/331 |
| 2013/0328122 A1 * | 12/2013 | Li | H01L 29/407 257/334 |
| 2014/0054691 A1 * | 2/2014 | Yilmaz et al. | 257/331 |
| 2014/0264569 A1 * | 9/2014 | Yedinak | H01L 21/02104 257/330 |

* cited by examiner

*Primary Examiner* — Lex Malsawma (57) ABSTRACT

A semiconductor device and a fabricating method thereof are provided. The semiconductor device includes: a substrate comprising a trench; a first electrode disposed below the trench; a second electrode disposed above the trench, a first insulating layer being disposed between the first electrode and the second electrode; a first contact arranged in a first direction of the substrate and connected to the first electrode; and a second contact arranged in second direction that is different from the first direction, the second contact being connected to the second electrode.

13 Claims, 7 Drawing Sheets

SEMICONDUCTOR DEVICE AND FABRICATING METHOD THEREOF

CROSS-REFERENCE TO RELATED APPLICATIONS

This application claims the benefit under 35 U.S.C. §119(a) Korean Patent Application No. 10-2012-0064548, filed on Jun. 15, 2012, in the Korean Intellectual Property Office, the entire disclosure of which is incorporated herein by reference for all purposes.

BACKGROUND

1. Field

The following description relates to a semiconductor device and a fabricating method thereof, and to, for example, a semiconductor device in which contacts for a plurality of electrodes are arranged inside a trench in different directions, and to a method of fabricating such a semiconductor device.

2. Description of Related Art

A MOS transistor, such as a double diffused MOS transistor, is often used as a high voltage semiconductor device. In such a MOS transistor, a channel is generally formed in a horizontal direction to the surface of the substrate. However, according to the recent decrease in design rules for constructing semiconductor devices, increasing attentions are paid on a trench MOS transistor such as a high voltage MOS transistor having a vertical channel for their efficiency in high level integration. The trench MOS transistor is generally constructed to have a drain arranged on a rear surface of the substrate, a source arranged on an upper surface of the substrate, and a gate arranged within a trench formed into a surface of the substrate. The electric current generally flows in an upward and downward direction of the substrate along the sidewall of the trench.

Figure 1:
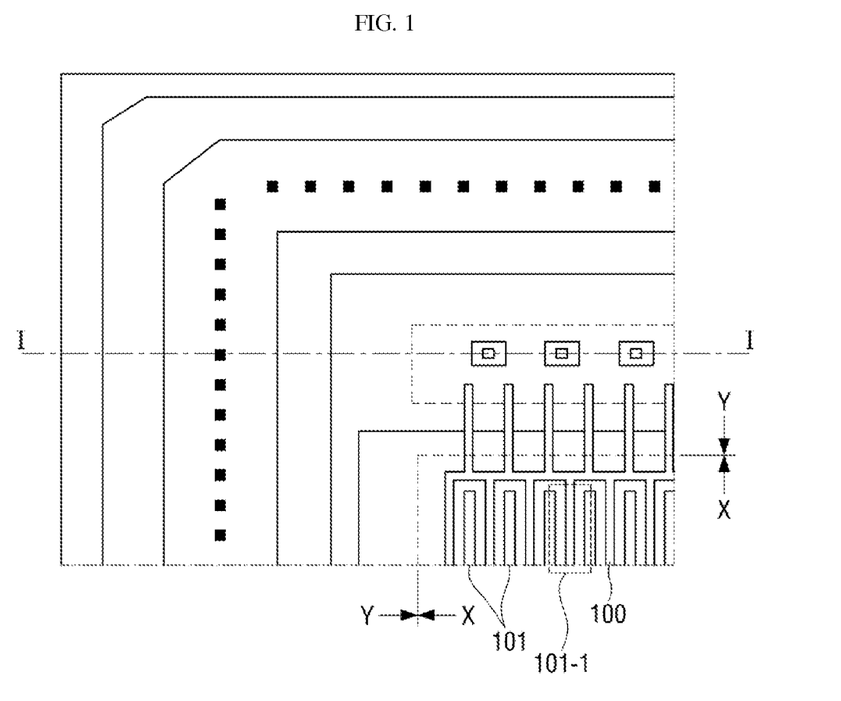
FIG. 1 is a plan view of a semiconductor device.
Figure 2:
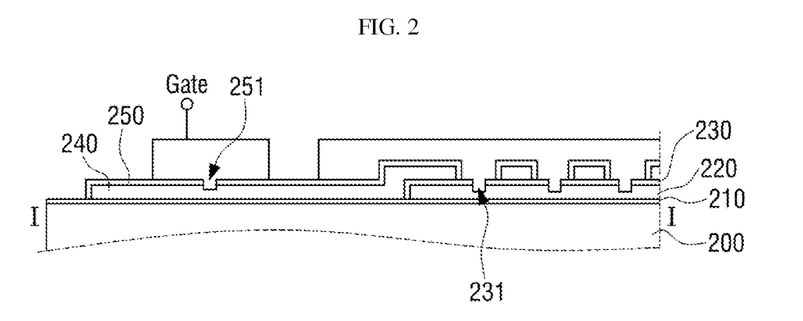
FIG. 2 is a cross-sectional view of the semiconductor device of FIG. 1 along line I-I.

FIG. 1 is a plan view of an active region and an edge region of a semiconductor device, and FIG. 2 is a cross-sectional view of the semiconductor of FIG. 1 along line I-I.

Referring to FIGS. 1 and 2, a semiconductor device is divided into an active region X and an edge region Y. The active region X includes a trench 100 and a trench transistor cell 101-1 and an active region interior contact 101, and the edge region Y includes a contact pattern to apply voltage to the electrodes. To be more specific, a first insulating layer 210 is formed on the substrate 200 with a source structure 220 formed on the first insulating layer 210, and a second insulating layer 230, a gate structure 240 and a third insulating layer 250 are formed thereabove. Contact holes 231, 251 are formed in the second and third insulating layers 230, 250, respectively.

Because of a wide overlapping area between the gate structure 240 and the source structure 220 on the edge region Y where the contact pattern is formed, the semiconductor device may deteriorate over time due to a current leakage between the gate and the source or the gate and the drain.

SUMMARY

In one general aspect, there is provided a semiconductor device including: a substrate comprising a trench; a first electrode disposed below the trench; a second electrode disposed above the trench, a first insulating layer being disposed between the first electrode and the second electrode; a first contact arranged in a first direction of the substrate and connected to the first electrode; and a second contact arranged in second direction that is different from the first direction, the second contact being connected to the second electrode.

The general aspect of the semiconductor device may further comprise a second insulating layer provided on a lower portion and on a sidewall of the trench.

In the general aspect of the semiconductor device, the first and second directions may be perpendicular to each other.

In the general aspect of the semiconductor device, the trench may be formed by crossing of trenches.

The general aspect of the semiconductor device may further comprise: a third insulating layer formed on the second electrode; a third electrode formed on the third insulating layer; and a fourth electrode formed below the substrate.

In the general aspect of the semiconductor device, the first electrode may be a shield electrode, the second electrode may be a gate electrode, the third electrode may be a source electrode, and the fourth electrode may be a drain electrode, and the shield electrode may be configured to alter an electric field pattern inside the semiconductor device according to a voltage applied to the first contact.

In the general aspect of the semiconductor device, the first and second contacts may be metal patterns.

In the general aspect of the semiconductor device, the first and third electrodes may be electrically connected to each other.

In the general aspect of the semiconductor device, the first electrode, located below the first contact, may be formed on the substrate with the second insulating layer disposed between the substrate and the first electrode, and the second electrode, located below the second contact, may be formed on the substrate with the first insulating layer disposed between the substrate and the second electrode.

In the general aspect of the semiconductor device, the first electrode, located below the first contact, may not overlapped with the second electrode, and the second electrode, located below the second contact, may not overlapped with the first electrode.

In the general aspect of the semiconductor device, the first and second electrodes may comprise polysilicon.

In another general aspect, there is provided a method for fabricating a semiconductor device, involving: providing a substrate comprising a trench; forming a first electrode below the trench; forming a first insulating layer on the first electrode; forming a second electrode above the trench; connecting a first contact that is arranged in a first direction of the substrate, to the first electrode; and connecting a second contact that is arranged in a second direction different from the first direction, to the second electrode.

The general aspect of the method may further comprise: forming a second insulating layer on a lower surface and a sidewall of the trench and on the substrate before the forming of the first electrode.

In the general aspect of the method, the first and second directions may be perpendicular to each other.

In the general aspect of the method, the trench may be formed by crossing of trenches.

The general aspect of the method may further comprise: forming a third insulating layer on the second electrode; forming a third electrode on the third insulating layer; and forming a fourth electrode on a lower portion of the substrate.

In the general aspect of the method, the first electrode may be a shield electrode, the second electrode may be a gate electrode, the third electrode may be a source electrode, and the fourth electrode may be a drain electrode, and the shield electrode may be configured to alter an electric field pattern inside the semiconductor device according to a voltage applied to the first contact.

In the general aspect of the method, the first and third electrodes may be electrically connected to each other.

In the general aspect of the method, the first and second contacts may be made from a same material.

In the general aspect of the method, the first electrode, located below the first contact, may be formed on the substrate with the second insulating layer disposed between the substrate and the first electrode, and the second electrode, located below the second contact, may be formed on the substrate with the first insulating layer disposed between the substrate and the second electrode.

In the general aspect of the method, the first and second electrodes may comprise polysilicon.

In the general aspect of the method, the connecting of the first contact to the first electrode may be performed concurrently with the connecting of the second contact to the second electrode.

In one general aspect, there is provided an MOS transistor including: a trench disposed in a substrate; a first electrode disposed in a lower portion of the trench; a second electrode disposed in an upper portion of the trench, the first and the second electrodes separated by an insulating layer; a first contact that extends in a first direction of the substrate and connects to the first electrode; and a second contact that extends in a second direction that is different from the first direction, and connects to the second electrode.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Various examples of semiconductor devices and fabricating methods thereof are described below. These examples of semiconductor devices may be characterized by contacts for a plurality of electrodes formed inside a trench that extends to different directions. While various examples of these semiconductor devices improve various characteristics of conventional semiconductor devices, the present description is not limited thereto.

Figure 3:
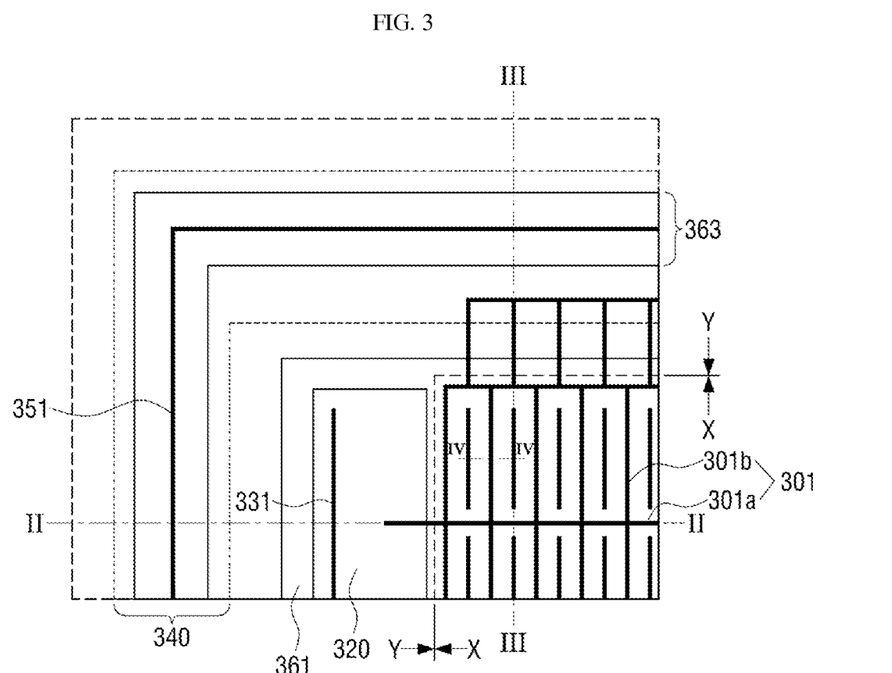
FIG. 3 is a plan view illustrating a portion of an example of a semiconductor device.
Figure 4:
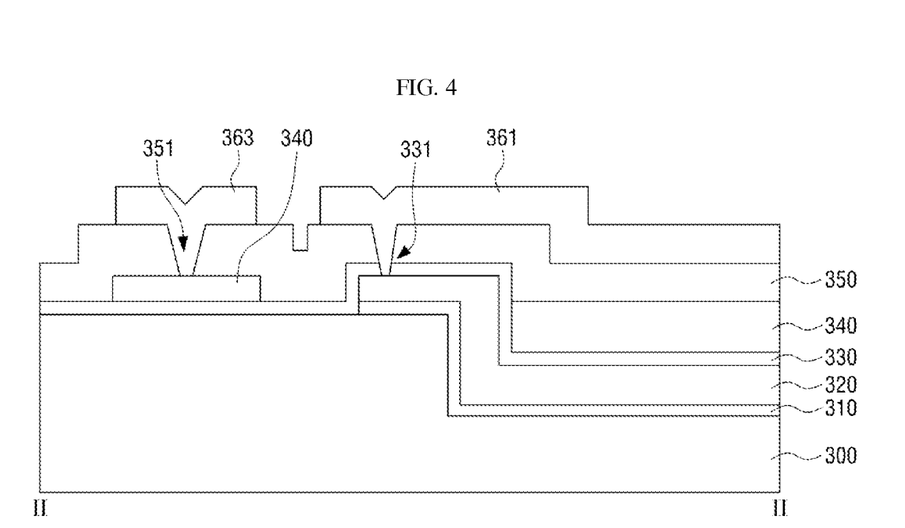
FIG. 4 is a cross-sectional view of the semiconductor device illustrated in FIG. 3 along line II-II.
Figure 5:
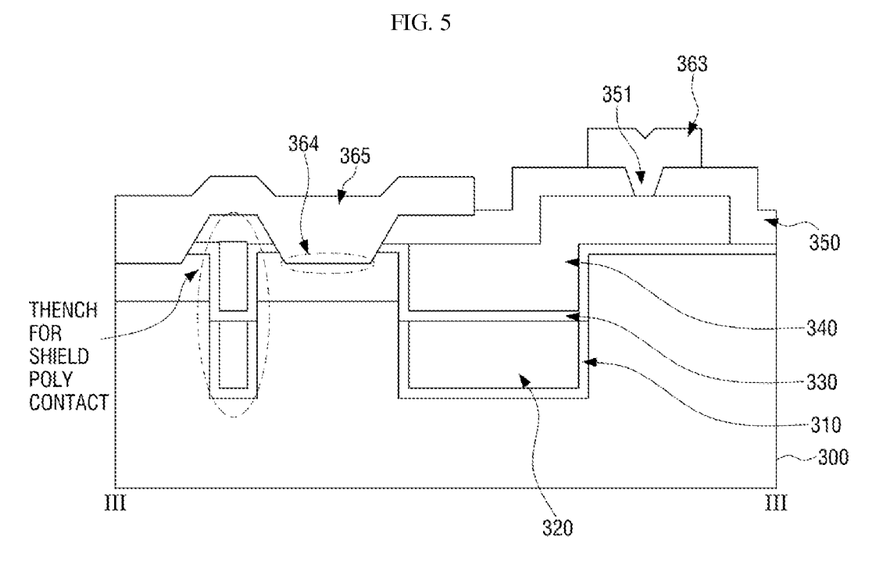
FIG. 5 is a cross-sectional view of the semiconductor device illustrated in FIG. 3 along line III-III.
Figure 6:
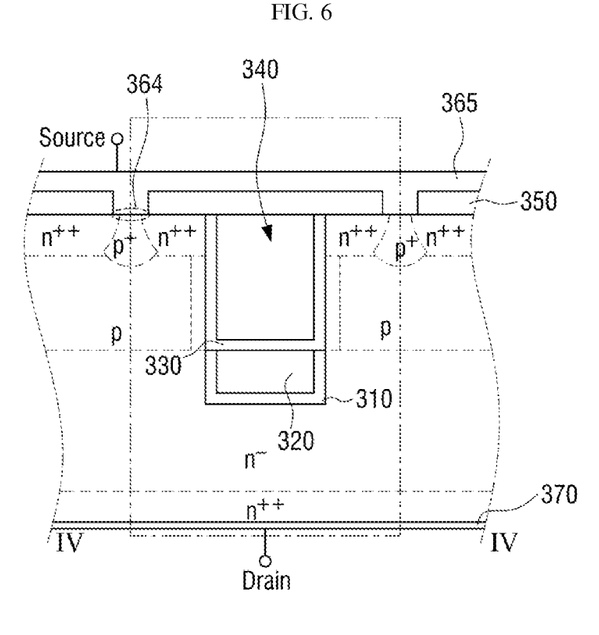
FIG. 6 is a cross-sectional view of the semiconductor device illustrated in FIG. 3 along line IV-IV.

FIG. 3 is a plan view illustrating a portion of an example of a semiconductor device. FIG. 4 is a cross-sectional view taken from the semiconductor device illustrated in FIG. 3 along line II-II. FIG. 5 is a cross-sectional view of the semiconductor device illustrated in FIG. 3 along line III-III. FIG. 6 is a cross-sectional view taken along line IV-IV of the semiconductor device illustrated in FIG. 3. Referring to FIGS. 3 to 6, an example of a semiconductor device may include, all or a portion of, a substrate 300, a first insulating layer 310, a first electrode 320, a second insulating layer 330, a second electrode 340, and a third insulating layer 350. The semiconductor device may additionally include, all or a portion of, a third electrode 365 and a fourth electrode 370. The phrase the semiconductor device may 'include all or a portion of' encompasses an example in which one or more of the constituents are integrated into another or are omitted. For example, in addition to the first and second electrodes 320, 340, the semiconductor device may further include at least one of the third and fourth electrodes 365, 370. Various examples of semiconductor devices will be explained below, with reference to a semiconductor device that includes all, or a portion of, the above-mentioned constituents.

The substrate 300 may be a wafer or a glass substrate. For example, the substrate 300 may be formed on one side of the semiconductor device. The substrate 300 may be a remnant of a structure that is left on a rear surface of the semiconductor device, as illustrated in FIG. 3. The substrate 300 may be left on the rear surface to have a predetermined thickness after applying a separate process such as a grinding or a chemical mechanical polishing (CMP) process. In an example, a substrate 300 that comprises a predetermined remaining portion having a predetermined thickness may be referred to as a 'buffer layer.' As illustrated in FIG. 3, the substrate 300 may be divided into an active region X at which semiconductor devices are formed in the form of cells, and into an edge region Y in which contacts to apply voltage to the semiconductor devices are provided. For example, a contact pattern may be formed in the edge region Y. A trench 301 may be formed in both the active region X and in the edge region Y of the substrate 300.

The trench 301 may include a trench 301a that extends in a first direction of the substrate 300, or extends in a leftward direction when viewed with reference to FIG. 3. A trench 301b may extend in a second direction that is perpendicular to the first direction, or the direction in which the trench 301a extends. The trench 301, as a whole, may form a matrix or a meshed net in the edge region Y, extending in the second direction.

A first insulating layer 310 may be formed over an entire surface of the substrate 300 with the trench 301 formed therein. The first insulating layer 310 may be formed on both the lower surface and the sidewalls of the trench 301, as well as formed on the upper surfaces of the substrate 300.

Further, the first electrode 320 may be formed on the first insulating layer 310 that covers the substrate 300. Referring to FIGS. 4 and 6, the first electrode 320 may be arranged below the trench 301, and formed within the trench 301 in the first direction at the active region X, and formed also on the surface of the substrate 300 at the edge region Y. In instances in which the semiconductor device is a trench MOS transistor having two electrode structures formed within the trench 301, this may be referred to as a shield electrode or a field electrode. The shield electrode may play a role of changing electric field pattern inside the semiconductor device, according to the voltage applied to the first contact.

The second insulating layer 330 may be formed on the first electrode 320. Referring to FIG. 4, the second insulating layer 330 may include a first contact hole 331 that exposes the first electrode 320 to outside at the edge region Y in the first direction, thereby connecting the same electrically to the first contact pattern 361. The second insulating layer 330 may be made from the same material as the first insulating layer 310. In the example illustrated in FIGS. 3 and 4, the first contact hole 331 may be referred to as a 'first contact.' The first contact may extend to, and form a portion of, a first contact pattern 361. Referring to FIG. 4, the second insulating layer 330 electrically insulates the first electrode 320 from the second electrode 340 within the trench 301.

The second insulating layer 330 may be formed in an upper portion of the trench 301, and the second electrode 340 may be formed on the second insulating layer 330. The second electrode 320 may extend from the active region X of the substrate 300 in the second direction to connect to the second contact pattern 363 in the edge region Y. For instance, referring to FIGS. 4 and 5, concerning the first direction of the edge region Y, the second electrode 340 inside the trench 301a may extend in the first direction toward the edge region Y. Thus, the second electrode 340 may be formed only inside an interior portion of the trench 301a, and not formed to protrude above the upper surface of the substrate 300. However, concerning the second direction of the edge region Y, since the second electrode 340 inside the trench 301b extends in the second direction toward the edge region Y and is formed as to protrude above on the upper surface of the substrate 300 in addition to being provided inside the interior of the trench 301b, an overlapping area between the first and second electrodes 320, 340 in the edge region Y of the substrate 300 decreases.

Further, the third insulating layer 350 may be formed on the second electrode 340. The third insulating layer 350 may include a second contact hole 351 to connect the second contact pattern 363 to the second electrode 340 in the edge region Y in the second direction. The second contact hole 351 may be formed concurrently with the first contact hole 331 on the second insulating layer 330, which is exposed to outside in the edge region Y in the first direction. Alternatively, the second contact hole 351 may be formed in a separate process. The examples described herein are not limited to a specific manner as to how the contact holes 331, 351 are formed. In another example, the contact holes 331, 351 may be provided in a form of an open line to increase the contact area between the respective electrodes and the contact pattern, thus reducing resistance.

Furthermore, the first and second contact patterns 361, 363 may be formed on the second and third insulating layers 330, 350 of the edge region Y and also on the third insulating layer 350 of the active region X, to electrically connect to the electrodes provided underneath through the first and second contact holes 331, 351. In an example, the third electrode 365 of the active region X, e.g., the source electrode may be formed concurrently upon the formation of the first and second contact patterns 361, 363. The first and second contact patterns 361, 363 and the third electrode 365 may be made of a conductive metal. Further, the first and second contact patterns 361, 363 of the edge region Y may be used as a voltage applying portion to which voltage is applied, and the first contact pattern 361 may be electrically connected to the third electrode 365.

Meanwhile, in another example, the process of making a semiconductor device may include etching a first insulating layer 310 provided on an active region X before the formation of a third insulating layer 350. Considering that the second insulating layer 330 and the second electrode 340 may also be etched during the etching of the first insulating layer 310, the present description is not limited to semiconductor devices using any specific manner of forming the first insulating layer 310. Further, the insulating layers, i.e., the first, second and third insulating layers 310, 330, 350 may be formed from, for example, a silicon nitride layer or a silicon oxide layer, but the materials for forming the insulating layers are not limited thereto.

Referring to FIG. 6, in another example, in preparation of forming a semiconductor device on the substrate 300, doped layers, such as a high concentration n++ layer, a low concentration n− layer, a P type layer, or a high concentration p+ layer, may be formed in separate processes. In an example, the doped layers may be formed by forming a separate epitaxial layer on the substrate 300 and then forming a high concentration n++ layer, the low concentration n− layer and/or the P type layer on the epitaxial layer. In this example, the trench 301 may be formed after the doping process. After that, the high concentration n++ layer and high concentration p+ layer may be formed to form a drift region before the third insulating layer 350 is formed. However, the present description is not limited to any specific manner of forming the doped layers. For example, the doping layers may be formed by an optional doping process and diffusing the impurities.

Furthermore, the semiconductor device may include a drain electrode, which is the fourth electrode 370 formed on a lower surface of the substrate 300 with a remaining portion of a predetermined thickness. The remaining portion may be the portion remaining after the chemical mechanical polishing (CMP) that is conducted on the lower surface of a wafer, for example. The fourth electrode 370 may be formed from the same material as the third electrode. The fourth electrode 370 may additionally include an implant layer to be used as a P type collector, formed by baking after P type implant is conducted between the fourth electrode 370 and the substrate 300.

Due to the construction explained above, the semiconductor device according to the described examples can minimize the overlapping area between a shield poly that is implementable as the first electrode 320 and a gate poly which is implementable as the second electrode 340. Thus, the occurrence of the leakage current may be prevented or reduced. Furthermore, because the resistance value in respective regions of the shield poly (i.e., first electrode 320) is reduced, an overall balance may be achieved, and a more stable potential may be obtained in the first electrode 320 in the active region X.

Further, since a lateral connection to the gate poly is enabled via the trench structure that has a lattice form, good signaling may be provided to the second electrode 340 of the gate poly. As a result, the gate resistance (Rg) is reduced.

Figure 7:
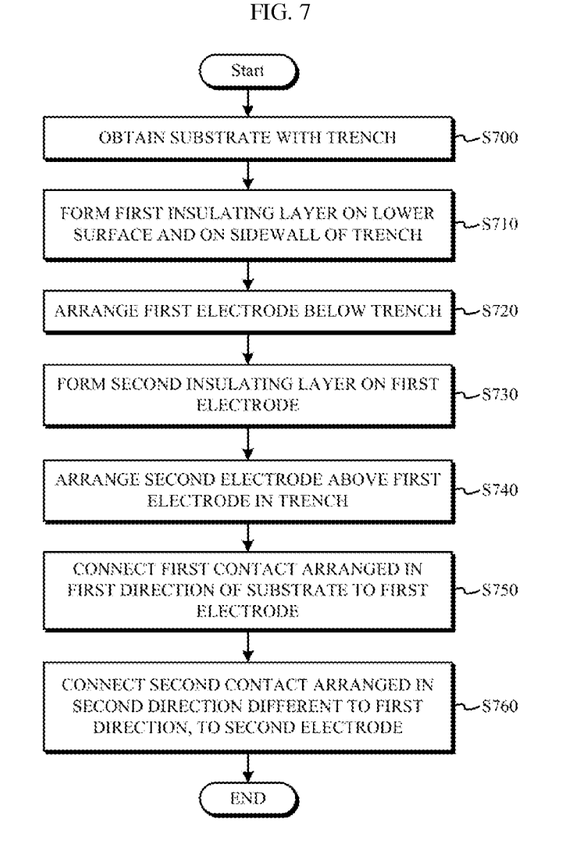
FIG. 7 is a flowchart illustrating an example of a fabricating method of a semiconductor device.

FIG. 7 is a flowchart that explains an example of a manufacturing method of a semiconductor device.

Referring to FIG. 7 in addition to FIGS. 3 to 6, the semiconductor device according to this example may be obtained by preparing a substrate 300 including a trench 301 therein, at S700. In this example, a trench may be formed on a surface of the substrate 300 on which a separate n++ epitaxial layer or n+ layer is formed. However, alternative methods may be used to obtain a substrate 300 having a trench 301. For example, if no separate epitaxial layer may be formed or if an epitaxial layer is formed, a trench may be formed after a high concentration n++ layer, a low concentration n− layer and a P type doping layer are formed with respect to the epitaxial layer. The doping layers may be obtained by applying an optional doping process and/or diffusion of impurities.

At S710, the first insulating layer 310 is formed on a lower surface of the trench 301 and on a sidewall of the trench 301. The first insulating layer 310 may be formed by: first forming the first electrode 320 on an insulating layer such as silicon oxide layer or silicon nitride layer on top of the substrate 300 including therein the trench 301, and then performing etching by photolithography, thereby leaving the first insulating layer 310 and the first electrode 320. Alternatively, the first electrode 320 and the second insulating layer 330 may be formed in sequence on the first insulating layer 310, and then performing an etching concurrently on the first and second insulating layers 310, 330, thereby leaving the first insulating layer 310. However, the present description is not limited to any specific process of forming the first insulating layer 310.

Further, at S720, the first electrode 320 is formed below the trench 301 having the first insulating layer 310 formed thereon. Since the first electrode 320 is made from polysilicon, in some examples, the first electrode 320 may be referred to as a 'shield poly.' The shield poly may be formed on a surface of the substrate 300 as well as the trench 301 in the edge region Y in the first direction with respect to the active region X. In this example, the shield poly may be formed only inside the trench 301 in the edge region Y in the second direction that is perpendicular to the first direction.

After that, at S730, S740, the second insulating layer 330 is formed on the first electrode 320, and the second electrode 340 is formed above the trench 301 having the second insulating layer 330 formed thereon. The second electrode 340 is made from polysilicon. Thus, depending on the example, the second electrode 340 may be referred to as a 'gate poly.' The second electrode 340 may have an opposite structure to the first electrode 320.

At S750, S760, in the first direction of the substrate 300, the first electrode 320 is connected to the first contact pattern 361 of the first contact. In the second direction that is different from the first direction, the second electrode 340 is connected to the second contact pattern 363 via a second contact. The first and second contacts may be connected to each other in the edge region Y. Depending on the example, the contacts may be understood to be the contact patterns which contact the electrodes via contact holes, respectively, after the contact holes are formed. However, the contacts may also be understood to be the structures that include the contact holes. Accordingly, the first contact, which is connected to the first electrode 320, may be referred to as the 'shield pattern.' The second contact, which is connected to the second electrode 340, may be referred to as the 'gate pattern.' In this example, the shield pattern and the gate pattern may be isolated from each other electrically. Further, while the source contact 364 in the active region X of the substrate 300 may form the third electrode 365 and electrically isolated from the gate pattern. The third electrode 365 may function as the source electrode. The source contact 364 may be electrically connected to the shield pattern.

For example, in the preparation of a semiconductor device according to FIG. 6, the high concentration n++ layer and the high concentration p+ layer, which form the drift region in the proximity to the trench 301, may be formed before the third insulating layer 350 is formed on the second electrode 340 in the active region X. After that, by forming the first and second contact holes 331, 351 in the second and third insulating layers 330, 350, the first and second electrodes 320, 340 may be connected to the corresponding first and second contact patterns 361, 363, respectively. As a result, voltage applied via the first and second contact patterns 361, 363 may be transmitted to the first and second electrodes 320, 340 of the active region X.

In this example, after the formation of the contact patterns 361, 363, the rear surface of the substrate 300 may be treated with a grinding process or a CMP. The fourth electrode 370 may be formed on the rear surface of the substrate 300 that has a predetermined remaining thickness. Before forming the fourth electrode 370 that forms the drain electrode, the P-type implant layer may be formed.

According to various examples of processing methods described above, a semiconductor device having a minimized overlapping area between the shield poly implementable as the first electrode 320 and the gate poly implementable as the second electrode 340 may be obtained to reduce or prevent the occurrence of leakage current. Furthermore, due to the reduced resistance value in the respective regions of the shield poly, such as the first electrode 320, an overall balance may be achieved. Thus, stable potential of the first electrode 320 may be obtained in the active region X.

Furthermore, since the lateral connection of the gate poly is possible via the trench structure that is in the lattice form, good signaling may be provided to the second electrode 340 of the gate poly. As a result, gate resistance (Rg) may be reduced.

It is understood that the features of the present disclosure may be embodied in different forms and should not be constructed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device comprising:
a substrate comprising a trench;
a first electrode disposed on a bottom of the trench;
a second electrode disposed on the first electrode, a first insulating layer being disposed between the first electrode and the second electrode;
a first contact arranged to contact with an extension of the first electrode; and
a second contact arranged to contact with an extension of the second electrode,
wherein the extension of the first electrode extends in a first direction of the substrate, and the extension of the second electrode extends in a second direction of the substrate, the second direction being perpendicular to the first direction.

2. The semiconductor device comprising:
a substrate comprising a trench;
a first electrode disposed below the trench;
a second electrode disposed above the trench, a first insulating layer being disposed between the first electrode and the second electrode;
a first contact arranged to contact with an extension of the first electrode extending in a first direction of the substrate; and
a second contact arranged to contact with an extension of the second electrode extending in a second direction that is different from the first direction,
wherein the first electrode is located below the first contact and does not overlap with the second electrode along the second direction, and
the second electrode is located below the second contact and does not overlap with the first electrode along the first direction.

3. The semiconductor of claim 2, further comprising a second insulating layer provided on a lower surface and on a sidewall of the trench.

4. The semiconductor device of claim 3, further comprising:
a third insulating layer formed on the second electrode;
a third electrode formed on the third insulating layer; and
a fourth electrode formed below the substrate.

5. The semiconductor device of claim 4, wherein the first electrode is a shield electrode, the second electrode is a gate electrode, the third electrode is a source electrode, and the fourth electrode is a drain electrode, and
the shield electrode is configured to alter an electric field pattern inside the semiconductor device according to a voltage applied to the first contact.

6. The semiconductor device of claim 5, wherein the first and second contacts are metal patterns.

7. The semiconductor device of claim 3, wherein the first electrode is located below the first contact, and is formed on the substrate with the second insulating layer disposed between the substrate and the first electrode, and the second electrode is located below the second contact and is formed on the substrate with the first insulating layer disposed between the substrate and the second electrode.

8. The semiconductor of claim 2, wherein the first and second directions are perpendicular to each other.

9. The semiconductor device of claim 2, wherein the trench is formed by crossing of trenches.

10. The semiconductor device of claim 9, wherein the first electrode is electrically connected to a third electrode.

11. The semiconductor device of claim 2, wherein the first and second electrodes comprise polysilicon.

12. An MOS transistor comprising:
a trench disposed in a substrate;
a first electrode disposed in a lower portion of the trench;
a second electrode disposed in an upper portion of the trench, the first and the second electrodes separated by an insulating layer;
a first contact arranged to contact with an extension of the first electrode; and
a second contact arranged to contact with an extension of the second electrode,
wherein the first electrode is located below the first contact and does not overlap with the second electrode along the second direction, and
the second electrode is located below the second contact and does not overlap with the first electrode along the first direction.

13. A semiconductor device, comprising:
a substrate comprising a trench;
a first electrode disposed below the trench;
a second electrode disposed above the trench, a first insulating layer being disposed between the first electrode and the second electrode;
a first contact arranged to contact with an extension of the first electrode; and
a second contact arranged to contact with an extension of the second electrode,
wherein the first electrode is located below the first contact and does not overlap with the second electrode along the second direction, and
the second electrode is located below the second contact and does not overlap with the first electrode along the first direction.

* * * * *